United States Patent
Corbeil et al.

(10) Patent No.: US 8,590,331 B2
(45) Date of Patent: Nov. 26, 2013

(54) COOLING UNIT FOR COOLING A DETECTION DEVICE IN AN IMAGING SYSTEM AND DETECTION DEVICES AND IMAGING SYSTEMS THEREFROM

(75) Inventors: James L. Corbeil, Knoxville, TN (US); Stefan Stocker, Großenseebach (DE)

(73) Assignees: Siemens Medical Solutions USA, Inc., Malvern, PA (US); Siemens Aktiengesellschaft, Munich (DE)

(*) Notice: Subject to any disclaimer, the term of this patent is extended or adjusted under 35 U.S.C. 154(b) by 431 days.

(21) Appl. No.: 12/903,445

(22) Filed: Oct. 13, 2010

(65) Prior Publication Data

US 2012/0091341 A1 Apr. 19, 2012

(51) Int. Cl.
F25D 23/12 (2006.01)

(52) U.S. Cl.
USPC .................................... 62/259.1; 62/259.2

(58) Field of Classification Search
USPC ............... 62/259.1, 259.2; 250/336.1, 515.1; 361/669, 719, 721; 165/104.33, 174, 165/67, 181
See application file for complete search history.

(56) References Cited

U.S. PATENT DOCUMENTS

| | | | | |
|---|---|---|---|---|
| 4,242,646 A | * | 12/1980 | Macken | 372/58 |
| 5,379,600 A | * | 1/1995 | Moritsu et al. | 62/47.1 |
| 6,645,354 B1 | * | 11/2003 | Gorokhovsky | 204/192.38 |
| 7,364,025 B2 | * | 4/2008 | Robb et al. | 192/21.5 |
| 2005/0088820 A1 | * | 4/2005 | Naganawa et al. | 361/697 |
| 2008/0274511 A1 | * | 11/2008 | Tan et al. | 435/91.2 |
| 2010/0006782 A1 | * | 1/2010 | Ladebeck | 250/515.1 |

* cited by examiner

*Primary Examiner* — Mohammad M Ali
(74) *Attorney, Agent, or Firm* — Peter Kendall (57) ABSTRACT

A cooling unit operating in a magnetic field is provided. The cooling unit includes an encasement body having a non-electrically conductive composition and defining a first and second opposing planar surface. The cooling unit also includes a metal conduit disposed in the encasement body substantially parallel to the first surface. Additionally, the cooling unit also includes a series of metal fins disposed in the encasement body and extending from the conduit. In some configurations the fins can be substantially parallel to the first surface. Further, in some configurations, non-electrically conductive inserts having a thermal conductivity greater than a thermal conductivity of the encasement body can be disposed in a portion of the encasement body between one of the first and second surfaces and one or more of the metals fins.

12 Claims, 7 Drawing Sheets

COOLING UNIT FOR COOLING A DETECTION DEVICE IN AN IMAGING SYSTEM AND DETECTION DEVICES AND IMAGING SYSTEMS THEREFROM

FIELD

The subject matter herein generally relates to cooling units for imaging systems, and in particular, to cooling units for detection devices in imaging systems.

BACKGROUND

In medical imaging so-called "hybrid modalities" are becoming increasingly important, for example PET-CT, SPECT-CT, PET-MRI and SPECT-MRI. The meanings of these abbreviations are as follows:
PET: Positron Emission Tomography
CT: Computer Tomography
SPECT: Single Photon Emission Computed Tomography
MRI: Magnetic Resonance tomography
The advantage of these combinations is the connection of a modality with a high local resolution for imaging anatomy (especially MRI or CT) to a modality with high sensitivity (especially SPECT or PET) for imaging/detecting biological processes, including cellular and metabolic processes.

In the case of MRI, locating an array of radiation imaging detectors inside the bore of a MRI system presents to the designer many technical challenges, which are exacerbated not only by spatial constraints, magnetic and gradient fields, but also by ohmic and eddy current heating. In general, the magnetic field strength and spatial constraints of a MRI system generally limit optical sensor selection to solid-state types, such as avalanche photo diodes (APDs) and silicon photo multipliers (SiPMs). However, most conventional PET and PETCT detectors rely on photo multiplier tubes (PMTs) as the primary optical sensing element since they are generally insensitive to temperature fluctuations since their photon conversion elements are incased within an evacuated tube. Unfortunately, most PMTs are highly susceptible to changes in magnetic fields. Further, most conventional PMTs for PET and PETCT detectors are relatively large (>100 mm). Accordingly, PMTs are generally impractical for use in the spatially restricted, magnetic environment of an MRI system.

In contrast, solid state photon sensors, such as APDs and SiPMs, are relatively small in height (1-2 mm) and are typically unaffected by the magnetic fields of an MRI system. However, the gain of such sensors can significantly fluctuate in response to temperature fluctuations of the ambient environment. Therefore, when APDs and SiPMs are used to form an optical sensing element for a PET detector, such gain fluctuations can be very detrimental to the operation of the PET detector, as it generally requires long term stability in the optical sensing element. Therefore, a PET detector designed for use in an MRI requires proper cooling if incorporating either APDs or SiPMs as its optical conversion element.

SUMMARY

Embodiments of the invention concern cooling units and systems for imaging devices. In a first embodiment of the invention, an apparatus operating in a magnetic field is provided. The apparatus includes an encasement body having a non-electrically conductive composition and defining a first and second opposing planar surface. The apparatus also includes a metal conduit disposed in the encasement body substantially parallel to the first surface. Additionally, the apparatus also includes a series of metal fins disposed in the encasement body and extending from the conduit. In some configurations, non-electrically conductive inserts having a thermal conductivity greater than a thermal conductivity of the encasement body can be disposed in a portion of the encasement body between one of the first and second surfaces and one or more of the metals fins.

In a second embodiment of the invention, a detection device is provided. The detection device includes at least one cooling unit having an encasement body of a non-electrically conductive composition and defining a first and second opposing planar surfaces of the cooling unit, a metal conduit disposed in the encasement body substantially parallel to the first surface, and a series of metal fins disposed in the encasement body and extending from the conduit. The detection device further includes a coolant delivery device coupled to the metal conduit and configured for directing a cooling fluid through the metal conduit at least one detector unit in thermal contact with the cooling unit. In some configurations, a controller can be provided for monitoring sensor temperature and adjusting flow and temperature of the cooling fluid.

In a third embodiment of the invention, a cooling unit for a sensor in a magnetic field is provided. The cooling unit includes an encasement body comprising a non-electrically conductive composition and defining first and second opposing planar surfaces. The cooling unit further includes a metal conduit disposed in the encasement body substantially parallel to the first surface and a series of metal fins disposed in the encasement body and extending from the conduit in a plane substantially parallel and equidistant to the first and second planes. The cooling unit further comprises a cooling fluid device coupled to the metal conduit and configured for directing a cooling fluid through the metal conduit.

In a fourth embodiment of the invention, a cooling unit for a sensor in a magnetic field is provided. The unit includes a planar metal conduit defining a first plane and a series of metal fins extending for the planar metal conduit, the series of fins extending primarily in a direction parallel to the first plane. The unit can further includes one or more non-electrically conductive portions in physical and thermal contact with at least the series of fins, where the non-electrically conductive portions configured to at least partially fill a minimum cuboid volume defined by the planar metal conduit and the series of fins.

BRIEF DESCRIPTION OF THE DRAWINGS

Embodiments of the present application will now be described, by way of example only, with reference to the attached Figures, wherein.

DETAILED DESCRIPTION

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As described above, one of the principal concerns when combining PET detectors using solid state sensors with an MRI system is providing proper cooling of the solid state sensors. Existing PET detectors, designed for use in an MRI environment, typically cool the solid-state sensor either by using circulating water, or other cooling liquid, or by blowing air over the component to be cooled. However, water cooling is generally a more efficient means of heat dissipation.

For purposes of water or liquid based cooling, metal structures, such as pipes and heat sinks, would be preferred for most environments. However, in the case of cooling devices within a magnetic field of an MRI system, the use of metal structures can be problematic due to the heating mechanisms and forces typically present. There are three main mechanisms for heating in an MRI: eddy current heating, ohmic heating, and frictional heating. Eddy currents are caused when a conductor is exposed to a changing magnetic field due to either the relative motion of the field source and conductor, or due to variations of the field with time. This effect can cause a circulating flow of electrons, or a current, within the body of the conductor. Eddy currents generate resistive losses that transform some forms of energy, such as kinetic energy, into heat. Ohmic heating, also known as Joule heating or resistive heating, is the process by which the passage of an electric current through a conductor releases heat. Frictional heating is caused when two bodies, in relative contact, rub against one other as they vibrate out of phase. The vibrations are induced within the detector as well as the surrounding elements, and are commonly a result of Lorentz Forces. A Lorentz force is the force on a point charge due to electromagnetic fields. Strong eddy currents, developed in relatively thick conductive materials, can also contribute to the development of Lorentz Forces.

Accordingly, although outside the MRI environment, a detector could be conceivably cooled by a structure manufactured from a chunk of copper or metal, with water (or air) flowing through the structure to dissipate the heat it has absorbed from the detector electronics. However, inside the MRI bore, the heating mechanisms described above generally render any cooling gains nil. As a result of the limitations of metal cooling structures, MRI/PST systems can utilize a polymer channel and/or by blowing air over the heat generating components, since polymer cooling channels are generally insensitive to eddy current heating and Lorentz Forces. However, these approaches, together or in combination, have only limited success in providing adequate cooling of a PET detector.

In view of the foregoing, embodiments of the invention provide improved cooling units for cooling detection devices in an MRI-based imaging system and methods thereof. In particular, a metal comprising cooling unit is provided in which the configuration of the components in the cooling unit is selected such that the amount of heating due to eddy currents, ohmic heating, and Lorentz forces is less than the amount of cooling provided by the cooling fluid.

In particular, the various embodiments provide cooling units including a metal conduit having a series of metal fins. In such cooling units, the conduit and fins are kept from coming into electrical contact by encasing them in an encasement body consisting of electrically non-conductive materials. In the various embodiments of the invention, the composition of the fins and conduit and the size and arrangement of the fins can be selected to reduce heating due to eddy currents, ohmic heating, and Lorentz forces.

With respect to ohmic heating, such heating can be reduced by utilizing high thermal conductivity materials, such as metals. For example, in one embodiment of the invention, copper-comprising alloys are used. However, other embodiments of the invention, silicon or diamond conductors can also be used. With respect to Lorentz forces, these forces provide heating in absence of an applied current when strong eddy currents are present. Accordingly, by configuring the conduit and fins to reduce eddy currents, heating due to such currents and Lorentz forces is also reduced.

Heating in metals due to eddy currents is generally due to the thickness of the metal and the total volume. For example, the power loss per unit volume of a metal sheet can be calculated as:

$$P = \frac{\pi^2 B_p^2 d^2 f^2}{6\rho D}. \tag{1}$$

where $B_p$ is the peak flux density (T), d is thickness of the sheet (m), $\rho$ is the sheet resistivity ($\Omega$m), $\sigma$ is electrical conductivity, $\mu$ is magnetic permeability, and D is the penetration depth or skin depth (m). For equation (1), D is given by:

$$D = \frac{1}{\sqrt{\pi f \mu \sigma}} \tag{2}$$

Thus, to minimize eddy current heating in a conduit including fins, a smaller thickness for the fins would be needed. Further, a smaller total volume for the fins would also be need. An additional consideration is the amount of Lorentz force being applied to the fins. That is, although a single fin occupying a volume and a pair of fins occupying substantially the same volume may generate approximately the same overall amount of eddy current, the two fin configuration will be preferred to minimize Lorentz forces. As used herein, the term "substantially" refers to being within 20% of the stated value, measurement, or quantity. That is, since the total amount of current in each of the fins will be lower than the total amount of current in the single fin, smaller Lorentz forces (and thus less heating) will be generated in the smaller fins as compared to the larger fin.

An additional consideration for the selection of fin size and number is the amount of heat that can be absorbed (i.e., the heat capacity rate) by a cooling fluid flowing through a conduit. This is generally expressed as $$C = c_p \frac{dm}{dt} \quad (3)$$

where $c_p$ is the heat capacity of the cooling fluid and $dm/dt$ is the mass flow rate of the cooling fluid. Further, the amount of heat transfer or flux each component can provide can also be considered. This can be generally expressed as $$\vec{q} = -k\nabla T \quad (4)$$

where k is the material's thermal conductivity, and $\nabla T$ is the thermal gradient.

Accordingly, the maximum amount of cooling a particular configuration of conduit, fins, and cooling fluid flow rate can be estimated using the equations above. Thus, when the dimensions are constrained, as in a PET-MRI system, such relationships can be used to determine the combination of conduits, fins, and cooling fluid flow rates that can be used to provide a desired amount of cooling for the PET-MRI system.

Accordingly, in the various embodiments of the invention, a series of fins is provided along the length of the conduit to provide a surface area for capturing heat and directing it into the cooling fluid, yet provide an arrangement of the fins to prevent significant heating due to eddy currents or Lorentz forces.

Although the various embodiments of the invention will be described primarily with respect to a combined PET-MRI system, this is only for illustrative purposes. The various embodiments of the invention are equally applicable to cooling of detection devices in any system where magnetic fields may be of concern.

Figure 1:
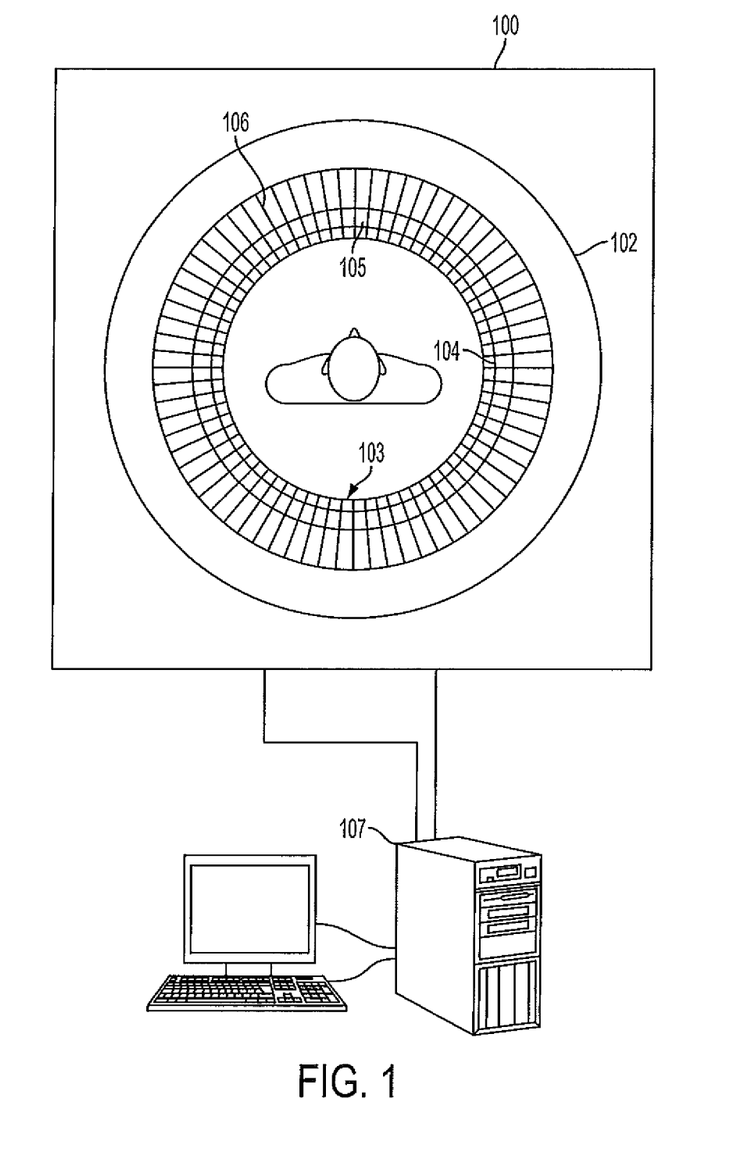
FIG. 1 shows a conventional facility for overlaid MRI and PET image display.

Referring now to FIG. 1, there is shown therein a conventional facility 100 for overlaid MRI and PET image display. The facility 100 consists of a known MRI tube 102. The MRI tube 102 defines a longitudinal direction z, extending orthogonally in relation to the plane of the drawing depicted in FIG. 1.

As is shown in FIG. 1, a number of PET detection units 103 are arranged coaxially within the MRI tubes 102 in opposing pairs around the longitudinal direction z. The PET detection units 103 can consist of an APD photo diode array 105 with an upstream array scintillators crystals 104, such as Lutetium Oxyorthosilicate (LSO) crystals or bismuth germinate (BGO) crystals, and an electrical amplifier circuit (AMP) 106. The invention is however not restricted to the PET detection units 103 with the APD photo diode array 105 and the upstream array of crystals 104, but other types of photo diodes, crystals and devices can likewise be used for detection.

The image processing for overlaid MRI and PET image display is undertaken by a computing system 107.

Along its longitudinal direction z the MRI tube 102 defines a cylindrical first image field. The plurality of PET detection units 103 defines along the longitudinal direction z a cylindrical second image field. In operation, the second image field of the PET detection units 103 essentially matches the first image field of the MRI tubes 102. This is implemented by a corresponding adaptation of the arrangement density of the PET detection units 103 along the longitudinal direction z to provide simultaneous imaging.

Figure 2A:
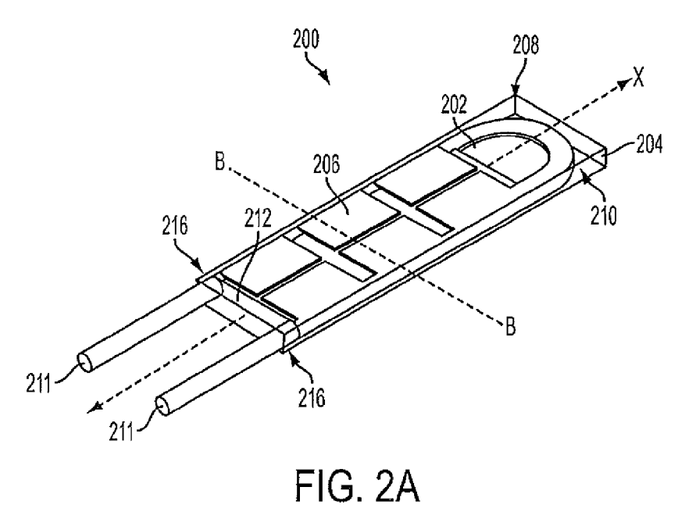
FIGS. 2A and 2B, show perspective and cross-section views of a cooling unit for a detection unit, such as PET detection unit in FIG. 1, in accordance with an embodiment of the invention.
Figure 2B:
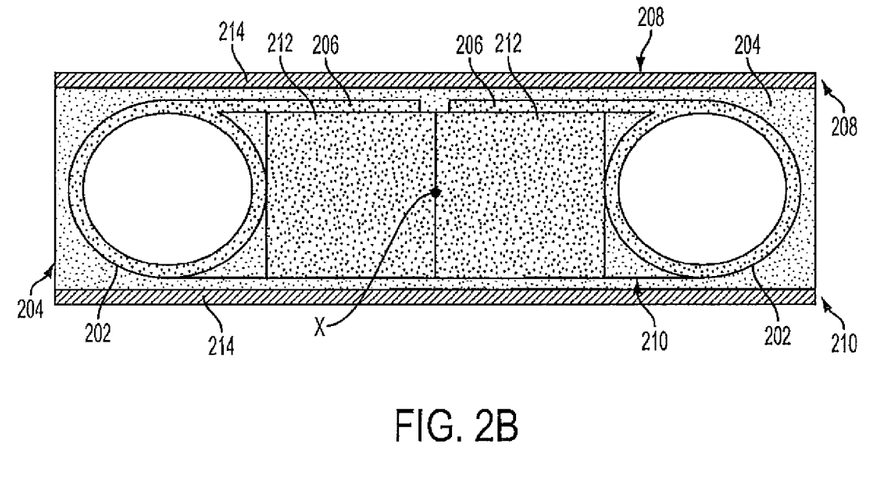

Referring now to FIGS. 2A and 2B, there are shown perspective and cross-section views of a cooling unit 200 for a detection unit, such as PET detection unit 103 in FIG. 1, in accordance with an embodiment of the invention. As shown in FIGS. 2A and 2B, cooling unit 200 includes a substantially cuboid encasement body 204 that supports with an upper cooling surface 208 and an opposing lower cooling surface 210 that is substantially parallel to the upper cooling surface 208. As used herein, the term "cuboid" refers to a shape or volume bounded by six substantially rectangular faces. In the various embodiments of the invention, the cooling unit 200 includes a high thermal conductivity conduit 202 disposed in a non-metal encasement body 204, where the conduit is configured for directing a coolant through encasement body 204.

In the configuration illustrated in FIGS. 2A and 2B, the conduit 202 is disposed in encasement body 204 substantially parallel to upper and lower surfaces 208, 210 of the encasement body, and is arranged as a loop extending a long a central axis X of unit 200 with a single turn. In particular, the conduit 202 is arranged such that the first and second ends of the conduit are not electrically coupled. Further, the conduit 202 is also arranged such that no portions of the conduit 202 are electrically coupled. Thus, no paths for significant eddy currents are provided along the length of conduit 202, or portions thereof. Although conduit 202 is shown as consisting of a single loop, the various embodiments are not limited in this regard. Rather, conduit 202 can have any geometry within encasement body 204, provided that the no portions of the conduit 202 are in physical and electrical contact. Thus in some embodiments ends of the conduit 202 need not exit from the same surface of encasement body 204.

Further, although conduit 202 is shown in FIG. 2B has having a diameter substantially equal to the thickness of encasement body 204 (i.e., the distance between surfaces 208 and 210), the various embodiments of the invention are not limited in this regard. Rather, conduit 202 can have any diameter less than the thickness of encasement 204. Further, in FIGS. 2A and 2B, conduit 202 is shown as having a substantially circular cross-sectional shape. However, in other embodiments of the invention, conduit 202 can have any other types of cross-sectional shapes. For example, conduit 202 can have an elliptical, oval, polygonal, or a rounded polygonal cross-sectional shape, to name a few. In some configurations, the cross-section shape can be selected to provide a thinner size for cooling unit 102. For example, a rounded rectangular shape can be configured to provide the same flow of cooling fluid and the same cooling capacity as a circular shape, but have a lower overall height or thickness.

In some embodiments, the conduit 202 can be formed using a copper-comprising composition, such as copper or alloys thereof. However, the various embodiments of the invention are not limited in this regard and conduit 202 can be formed from one or more other metals or alloys thereof. Further, the conduit can also be formed from ceramics, polymers or any other thermally conductive materials. However, higher thermal conductivity materials, such as metals and metal alloys will provide increased efficiency, as described below.

In addition to the conduit 202, the cooling unit 200 can also include a plurality of metal fins 206 extending from the conduit 202. In particular, the fins 206 are configured to extend from conduit 202 substantially parallel to the surfaces 208 and 210 of the encasement body 204. For example, as illustrated in FIGS. 2A and 2B, the fins 204 are configured to extend tangentially from conduit 202. Specifically, the fins 206 extend along upper surfaces 208 of cooling unit 200 and towards central axis X. In some embodiments, the fins 206 can be formed using a copper-comprising composition, such as copper or alloys thereof. However, the various embodiments of the invention are not limited in this regard and the fins 206 can be formed from one or more different metals or alloys thereof. In some configurations, the fins 206 can be integrally formed with conduit 202. In other embodiments, the fins 206 can be formed separately and thereafter attached to conduit 202. For example, the fins 206 can be welded to the conduit 202. In such embodiments, a welding process that provides a high thermal conductivity joint between fins 206 and conduit 202 is preferred. For example, a silver brazing process can be used to provide a high thermal conductivity joint.

In FIGS. 2A and 2B, the fins 206 are shown as being located along surface 208. However, the various embodiments of the invention are not limited in this regard. In other embodiments, the fins 206 can be located along both surfaces 210 and 208 and thus provide cooling along two surfaces of unit 200. In such configurations, the fins 206 can be provided in an alternating arrangement. That is, additional fins cannot be typically added, as the increased mass of metal leads to greater heating due to eddy currents and other forces.

As described above, the conduit 202 and the fins are disposed in encasement body 204. In the various embodiments of the invention the encasement body 204 is provided to support and hold in place the various components in cooling unit 202. Further, the encasement body 204 is also configured to provide some electric isolation between the various portions of the conduit 202 and the fins 206. In the various embodiments of the invention, the encasement body 204 can be formed using a variety of non-electrically conductive materials. For example, in some embodiments an epoxy, resin or other polymer can be used to form encasement. However, the various embodiments of the invention are not limited in this regard and any other types of non-electrically conductive materials can be used to form encasement body 204. In some configurations, a material with a relatively high thermal conductivity, but still electrically non-conductive, can be selected to improve the overall cooling efficiency of the unit 200. For example, encasement body 204 can be formed from a high thermal conductivity epoxy or ceramic. For example, high thermal conductivity ceramics include aluminum oxide or aluminum nitride.

As described above, although encasement body 204 can be formed using high thermal conductivity ceramic, high thermal conductivity epoxy, and/or other high thermal conductivity materials to improve the cooling efficiency of unit 200, such materials can cause that the production of the cooling unit 200 to be considerably more complex or costly. Further, such materials are typically more fragile and prone to damage. Therefore, in some embodiments, rather than forming the entire encasement body 204 from such materials, the cooling unit 200 can include one or more thermally conductive and electrically non-conductive inserts 212 disposed within encasement body 204, as shown in FIGS. 2A and 2B. Thus, an outer durable portion is provided by the encasement body 204 while the inserts 212 provide the higher thermal conductivity to improve cooling efficiency. As shown in FIGS. 2A and 2B, the inserts 212 are disposed within the encasement body 204 in the spaces within the cuboid volume of encasement body 204 bounded by fins 206 and/or conduits 202. To provide a high degree of heat transfer, the inserts 212 can be arranged to be in physical and thermal contact with fins 206 and conduits 202. For example, the inserts 212 can be bonded to fins 206 and/or conduits 202 using a high thermal conductivity adhesive.

As shown in FIGS. 2A and 2B, the cooling unit 200 is substantially planar. That is, the dimensions of surfaces 208 and 210 are significantly larger than the thickness of unit 200. As a result, during installation or other handling of unit 200, forces causing deformation of unit 200 will result in a largest amount of stress at surfaces 208 and 210. Accordingly, if the portion of encasement body 204 at surfaces 208 and 210 is sufficiently brittle or otherwise fragile, such stress can result in damage at surfaces 208 and 210. Accordingly, to further protect unit 200 from damage, unit 200 can include skins or films 214 at the upper surface 208 and lower surface 210 which can withstand such stresses. For example, in one embodiment, the skins can be formed using a layer of fiberglass, deformable polymers, or any other deformable and non-electrically conductive materials having a stiffness less than a stiffness of the materials comprising encasement body 204. In such cases, materials with a relatively low thermal conductivity can be used, as the thickness of such layers can be ~10× less than the total thickness of encasement body 204. For example, in one configuration, a 0.25 mm layer of fiberglass is used to form skins for an ~4 mm thick cooling unit.

Fluids (gases and/or liquids) are delivered into conduit via coolant lines 211 coupled to the ends of conduit 202. The coolant lines 211 can protrude, at least partially, into encasement body 204 and connect to the ends of conduit 202. The connections 216 at ends of conduit 202 and the coolant lines 211 can be configured to limit the flow and/or formation of eddy currents. For example, in the various embodiments of the invention, the coolant lines 211 are formed from non-electrically conductive materials, such as polymers or other non-electrically conductive materials suitable for transporting the cooling fluid. Further, the connections 216 between coolant lines 211 and conduit 202 can also be arranged to be electrically isolated from each other. Further, connections can be provided using low electrical conductivity or non-electrically conductive materials. Additionally, by assembling conduit 202, coolant lines 211, and connections 216 prior to forming the encasement body 204, the materials of the encasement body 204 seal connections 216 to provide little or no leakage of cooling fluid.

In operation, cooling unit 200 works as follows. First, a coolant is directed, via coolant lines 211, into encasement body 204 and into conduit 202. As a result of cooling fluid being directed through conduit 202, a temperature gradient is established in unit 200. That is, since the cooling fluid directly cools the conduit 202 and indirectly cools the fins 206, the inserts, and the body 204, a temperature difference exists between conduit 202 and other portions of unit. At the same time, surface 208 is placed in contact with an object and/or region requiring cooling. The heat in the object and/or region then propagates through film 214 and into at least one of encasement body 204, inserts 212, conduit 202, and fins 206. The resulting temperature gradients then causes heat to flow from film 214 to conduit 202 and into cooling fluid. In the case of a conventional conduit disposed in an encasement body, but without fins or inserts, cooling would occur. However, the relatively low thermal conductivity would provided a relatively low cooling efficiency. In contrast, the addition of fins 206 and inserts 212 provides high thermal conductivity paths to conduit 202. Thus, cooling efficiency is improved in the various embodiments of the invention as a result of the added high thermal conductivity paths.

Figure 3A:
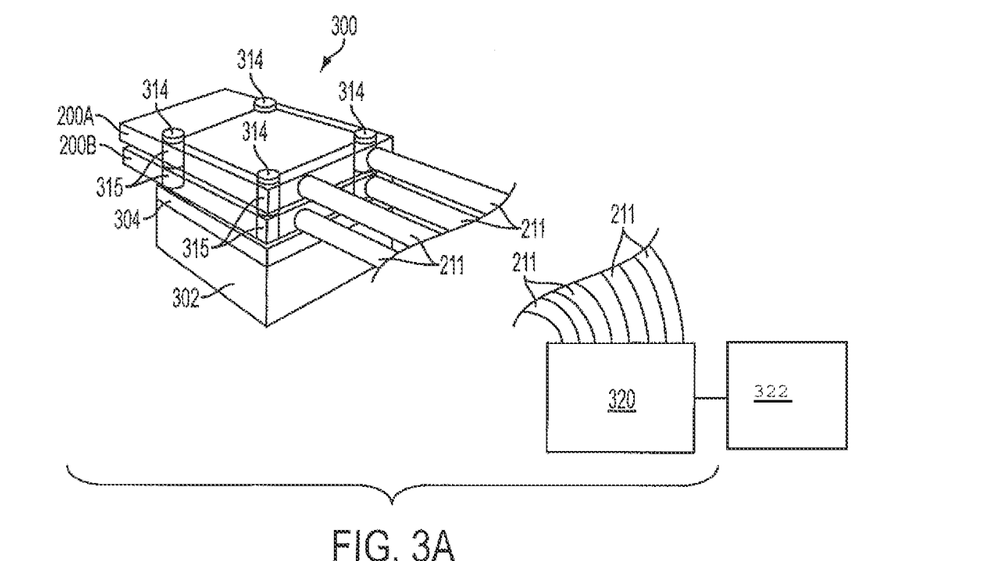
FIGS. 3A and 3B are perspective and cross-section views of a detection unit, such as PET detection unit in FIG. 1, including a cooling element in accordance with the various embodiments of the invention.
Figure 3B:
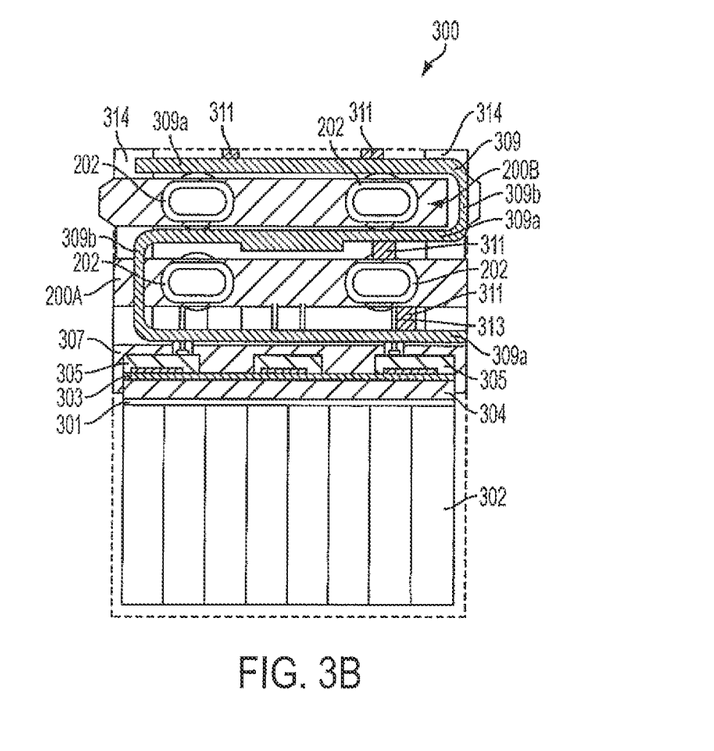

Such a configuration of a cooling unit can then be used for cooling sensor elements in a detection unit. An exemplary configuration is illustrated with respect to FIGS. 3A and 3B. FIGS. 3A and 3B are perspective and cross-section views of a detection unit 300, such as PET detection unit 103 in FIG. 1, including cooling element 200.

As shown in FIGS. 3A and 3B, the detection unit 300 is configured to have a lower area that features a scintillator crystal 302. Arranged above the crystal 302 are an optical waveguide 304 and two cooling units 200A and 200A. However, the various embodiments of the invention are not limited to two cooling units. Rather one or more cooling units can be used, depending on the amount of cooling required and any other factors. Further, the placement of the fins in each of the cooling units can be selected in accordance with the number of surfaces to be cooled.

In FIGS. 3A and 3B, each of units 200A and 200B is configured in substantially the same manner as cooling unit 200 described above with respect to FIGS. 2A and 2B. The coolant line 211 passes through each of the cooling units 200A and 200B at two points, enabling them to be cooled with coolant provided by at least one coolant delivery device 320 coupled to coolant lines 211. Coolant delivery device 320 can include one or more pumps, valves, reservoirs, and various other components for managing the delivery of coolant into a cooling unit. The crystals 302, the optical waveguides 304 and the two cooling units 200A and 200B can be coupled by retaining elements 314 extending through contact/retaining portions 315 of the cooling units 200A and 200B. Not shown in FIG. 3A are a number of APDs and a number of electronic components of a signal processing unit arranged between the cooling units 200A and 200B. This is shown in detail in FIG. 3B.

As shown in FIG. 3B, disposed between the crystal 302 and the optical waveguide 304 is a connecting or adhesive layer 301. Attached to the optical waveguide 304 is an intermediate or adhesive layer 303 above which a number of APDs 305 are arranged within a holder 307. The two cooling units 200A and 200B are in turn arranged above the holder 307. A coolant line 211 runs in two places for each of the cooling units 200A and 200B, through which the cooling units 200A and 200E can be supplied with coolant. The coolant line 211 is embodied within the cooling units 200A and 200B such that coolant coming from the coolant source not shown here initially flows through the cooling unit 200A. In the further route of the coolant line 211 this line carries coolant through the cooling unit 200B. In this way both the cooling unit 200A and also the cooling unit 200B can be used for cooling down the APD 305 by means of a single cooling source. However, the various embodiments of the invention are not limited in this regard and more than one cooling source can be used.

Disposed between the cooling units 200A and 200B, as well as the holder 307, is a circuit board 309. This has rigid sections 309a and flexible sections 309b and can thus be manufactured in one piece. The circuit board 309 is equipped with various electronic components 311. It also has electrical connections 313 to the APD 305. The components 311 located on the different sections 309a are able to be connected via conductor tracks via the flexible sections. The connection of the rigid and flexible sections 309a and 309b still enables the compact design shown to be implemented with a comparatively large circuit board surface.

The electronic components 311 or the board 309 are arranged, as shown in FIG. 3B, so as to be in thermal contact with the cooling units 200A and 200B at a number of points. Consequently these are also cooled by the cooling units 200A and 200B. Since a part of the circuit board 309 and some of the components 313 located on it lies between the cooling unit 200A and the holder 307 of the APD 305, there may be no provision for a direct thermal contact between the APD 305 and the cooling unit 200A. Rather, the thermal conductivity between the APD 305 via the holder 307, the circuit board 309 and the components 313 and the cooling unit 207 can be selected (i.e., be sufficiently high) in order to guarantee a good thermal coupling of the APD 305 to the cooling unit 200A. In some configurations, a thermally conductive foam or pad can be used between cooling units 200A and 200B and other components in detection unit 300 to provide an improved thermal contact.

In operation, the Gamma radiation is converted by scintillation into light by the scintillator crystal 302. The created light is forwarded via the optical waveguide 304 to the APD 305. These create pulses from the incident light stream which are passed on via the lines 313 to the circuit board 309 and its components 311. A provisional processing of received signals can takes place on the circuit board 309. The amplification of the APD 305 is temperature-dependent, which would lead to measurement inaccuracies with insufficient cooling down. Thus, a temperature stabilization in the range of a few degrees Celsius, preferably less than one degree, needs to be realized in order to guarantee a smooth operation of the detection unit 201. Thus, by having good thermal contact between the cooling unit 200A, the holder 307 of the APD 305 and board 309 and providing a cooling element design, as described above with respect to FIGS. 2A and 2B, an efficient and easy-to-implement cooling of the APD 305 and other components is provided. As a result, the self-heating of the APD 305 during operation can be more effective compensated as compared to conventional methods.

It is worth noting that the compact layout of PET-MRI systems means that in general there are a number of the detection devices 300 in the built-in state in the vicinity of various heat sources. In this case, the gradient coil can plays significant role in heat. Typically, the temperature of the gradient coil can fluctuate, depending on the operating state, between around 20 C and 80 C. Thus, the incident heat on the outside of the detector unit resulting from these temperature fluctuation can have a significant effect on the operating temperature of the APD 305 and thus on its amplification. Accordingly, by providing cooling unit 200B between the gradient coil and the APD 305, the incident heat can be greatly reduced, as compared to conventional cooling methods. As a result, a more stable operating behavior for the APD 305 can be obtained.

The exemplary configuration detection unit 300 has been described generally with respect to a passive cooling configuration, where no feedback is provided to coolant delivery system. However, the various embodiments of the invention are not limited in this regard and active control of the cooling in detection unit 300. That is, temperature sensors can be used to determine the temperature of one or more components in unit 300. For example, a thermocouple (not shown) or other temperature sensing device can be embedded or inserted into 300. The output of these sensors can then be provided to a controller 322. The controller 322 can then adjust the temperature and/or flow of the fluid from coolant delivery system 320 to increase the amount of cooling in detection unit.

In the exemplary embodiment shown in FIGS. 2A and 2B, the conduit 202 and the fins 206 are disposed in encasement body 204 in an inward arrangement. That is, the fins 206 extend towards a central axis of encasement body 204. However, the various embodiments of the invention are not limited in this regard. Rather, a cooling unit in accordance with the various embodiments can also include an outward configuration of fins. This is illustrated with respect to FIG. 4.

Figure 4:
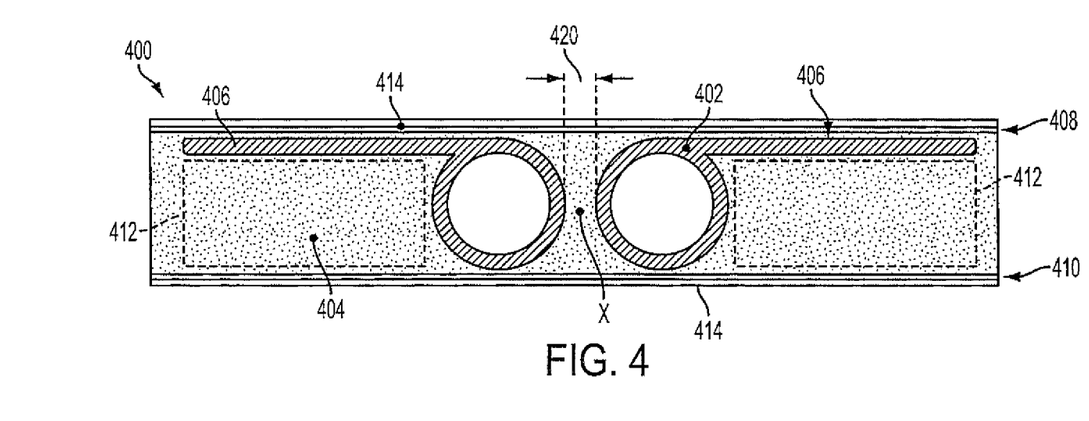
FIG. 4 is a cross-section of a cooling unit in accordance with another embodiment of the invention.

FIG. 4 is a cross-section of a cooling unit 400 in accordance with another embodiment of the invention. For illustrative purposes, cooling unit 400 includes substantially the same components as cooling unit 200. That is, cooling unit 400 includes a conduit 402, encasement body 404 with an upper surface 408 and a lower surface 410, fins 406, films 414, and optionally inserts 412. Thus, the description above for components 202-214 is sufficient for purposes of describing components 402-414 in FIG. 4. However, unlike unit 200, the cooling unit 400 is configured in an outward configuration. That is, the conduit 402 extends at or near a central axis of the cooling unit and separated by a spacing 420, where the spacing 420 is filled by the encasement body 404. In such a configuration, the fins 404 are configured to extend tangentially from conduit 402 and along upper surfaces 208 of cooling unit away from the central axis X of encasement 404.

Although the configurations of units 200 and 400 can provide substantial cooling in a PET-MRI system, such configurations are prone to damage due to temperature-induced bi-material effects. Temperature-induced bi-material effects occur when a laminate is formed consisting of two or more layers of materials and each of the layers has a different coefficient of thermal expansion. Thus, when a change in temperature occurs, each layer expands differently. For example, in the case of a laminate consisting of two layers, the first layer will expand more that the second layer. This can result in a non-zero stress being induced in the laminate by the difference in expansion and deformation of the laminate and possible damage to the laminate. Further, if a third layer is disposed between two such dissimilar layers, this third layer will be subject to a non-zero stress, possibly damaging the third layer.

In the configuration in units 200 and 400, such damage is possible at the fins. In particular, as shown in FIG. 2B, the unit forms a laminate consisting the ceramic insert, fins, and the epoxy forming the encasement body. As the ceramic insert and the epoxy will likely have different coefficients of thermal expansion, the ceramic insert and the epoxy will expand at different rates as temperature varies. As a result, a net stress is applied to the fins, causing deformation and possible damage to the fins and the cooling unit. Accordingly, in some embodiments of the invention, the position of the fins and/or inserts can be adjusted to reduce or eliminate such bi-material effects. Such a configuration is illustrated in FIGS. 5A-5E.

Figure 5A:
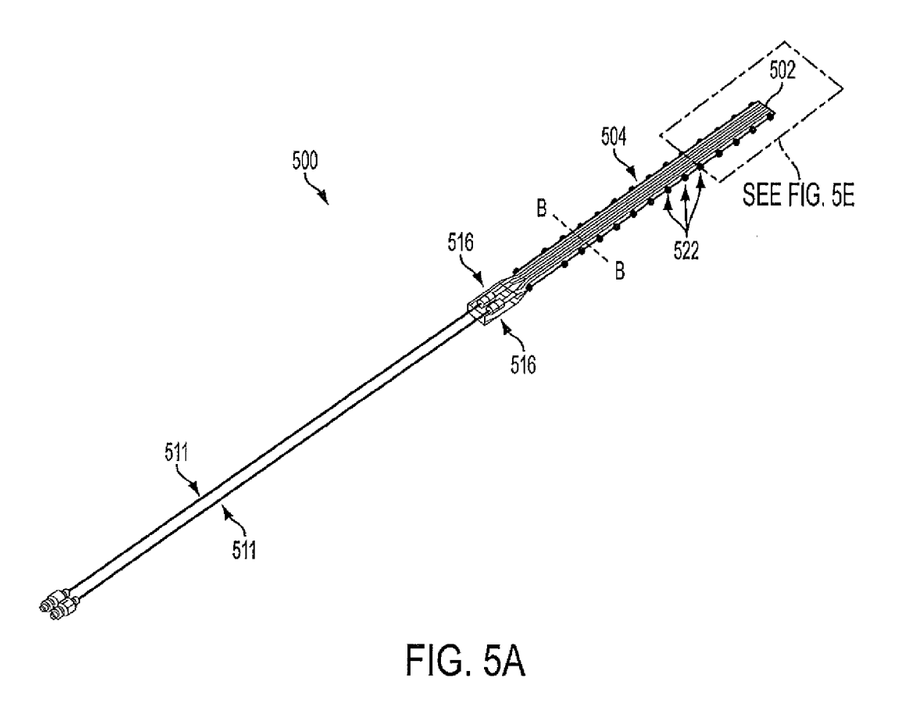
FIGS. 5A-5E show various views of a cooling unit in accordance with another embodiment of the invention.
Figure 5B:
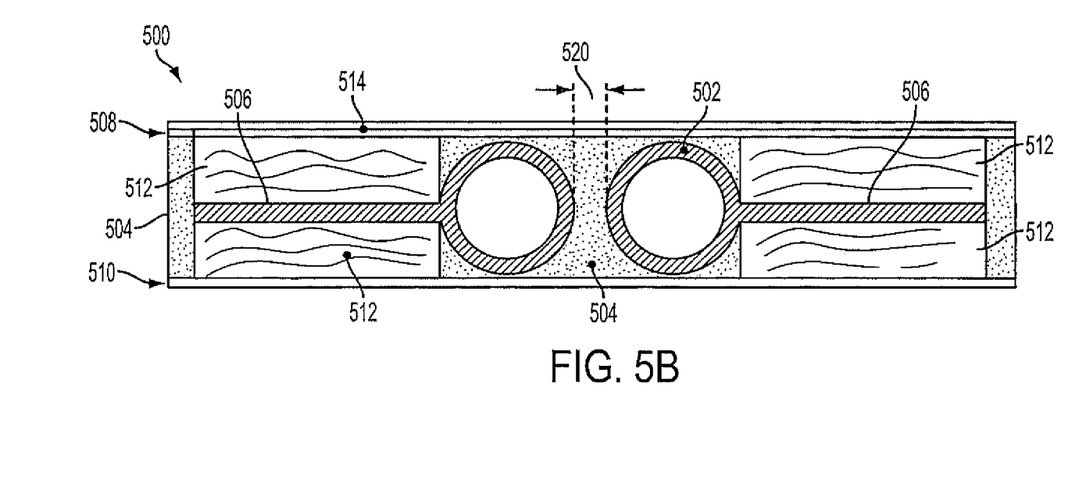
Figure 5C:
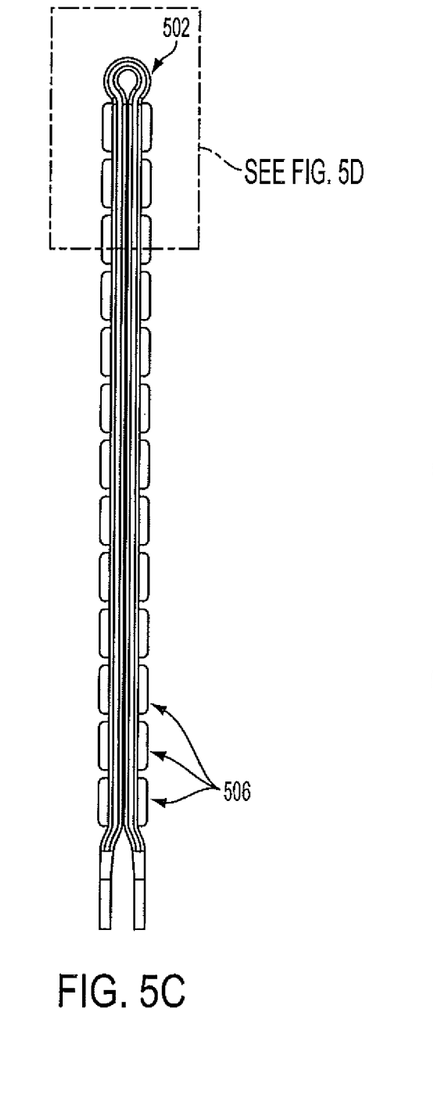
Figure 5D:
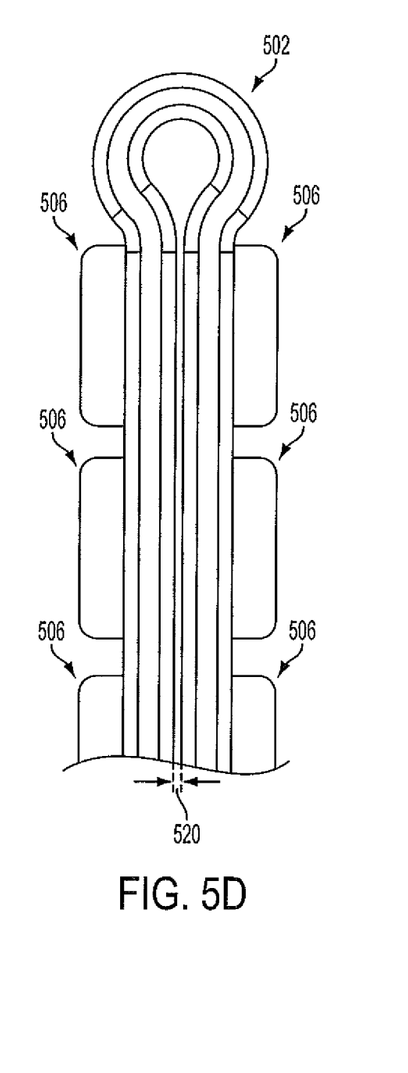
Figure 5E:
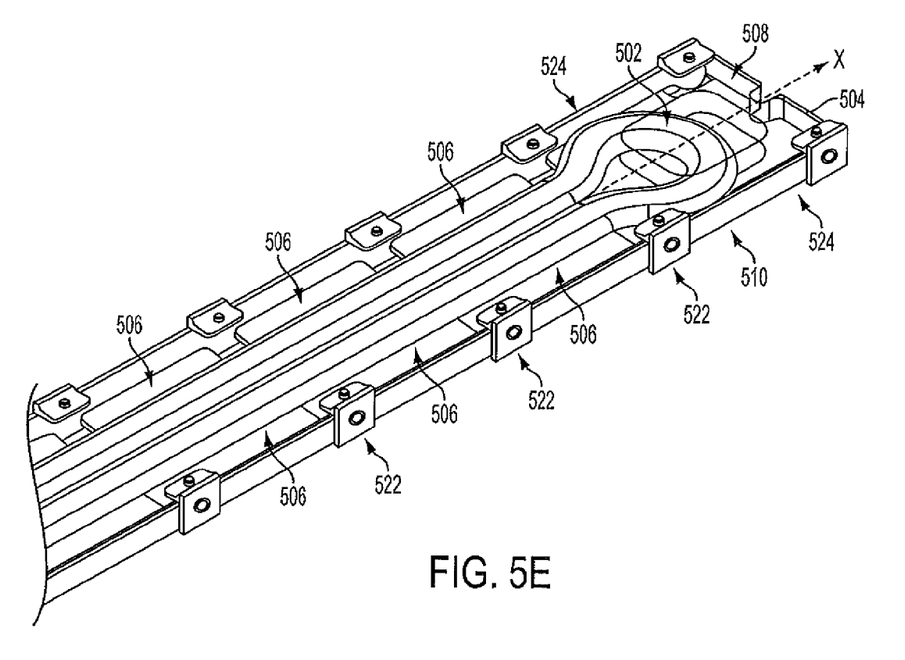

FIGS. 5A-5E show various views of a cooling unit 500 in accordance with another embodiment of the invention. FIG. 5A is a perspective view of cooling unit 500. FIG. 5B is a cross-section view of cooling unit 500 along cutline B-B in FIG. 5A. FIG. 5C is a schematic of the conduit 502 and fins 506 in cooling unit 500. FIG. 5D is a close-up view of section D of FIG. 5C. FIG. 5E is a close-up view of section E of FIG. 5A.

For illustrative purposes, cooling unit 500 also includes substantially the same components as cooling units 200 and 400. That is, cooling unit 500 includes a conduit 502, encasement body 504 with an upper surface 508 and a lower surface 510, fins 506, films 514, and optionally inserts 512. Thus, the description above for components 202-214 and components 402-414 is sufficient for purposes of describing components 502-514 in FIG. 4. Like unit 400, the cooling unit 500 is configured in an outward configuration. That is, the conduit 502 extends at or near a central axis of the cooling unit 500, separated by a spacing 520. The fins 506 are configured to extend from conduit 502 away from the central axis X of encasement body 504. However, in contrast to units 200 and 400, the fins 506 extend along a plane that is substantially equidistant from surfaces 508 and 510. As a result, when unit 500 is fully assembled, the components above and below fins 506 are symmetrically arranged. For example, in the case of unit 500, inserts 512 of approximately the same thickness and composition are provided on both sides of fins 506. In the absence of such inserts, the encasement body 504 would be of substantially the same thickness on both sides of fins 506. In either case, since the fins 504 have the same layers of material and the thickness of these layers on both sides is the same, these layers will deform in approximately the same way. Thus, these layer will apply substantially the same amount of force to the fins, but in opposing directions. As a result, these forces are balances and the net stress on the fins is zero. Accordingly, damage to the unit is minimized.

In the configuration illustrated in FIG. 3 the cooling units 200A and 200B are attached to the remainder of unit 300 via a plurality of retaining elements 314 extending through contact/retaining portions 315. As shown in FIG. 3, the portions 315 extend substantially perpendicular to the upper and lower surfaces of each of cooling units 200A and 200B through contact portions of the cooling units. However, the various embodiments are not limited in this regard. For example, in the configuration illustrated in FIGS. 5A-5E, the unit 500 further includes contact/retaining portions 522 on side surfaces of cooling unit 500 (i.e., perpendicular to the surfaces 508 and 510) and disposed along the length thereof. Accordingly, other components of a detection unit to be cooled by cooling unit 500 can be attached thereto. Additionally, the position of contact/retaining portions 314 or 522 can be selected so to minimize the dimensions of an encasement body. For example, as shown in FIG. 5E, the positions contact/retaining portions 522 can be selected to coincide with a position of a slot or spacing between fins. Accordingly, no additional volume of encasement body 504 would be required to provide such portions.

In some embodiments, to provide further strength to a cooling unit, one or more support frames can be attached to the encasement body. For example, as shown in FIG. 5E, support frames 524 are attached along the length of encasement body 504. Such support frames can be used to provide additional beam or load strength, particularly in the case of cooling units that extend in a longitudinal direction, such as cooling unit 500. To prevent any additional heating, such frames can also be fabricated from high strength non-electrically conductive materials.

Although, the various embodiments have been described herein with respect to a PET-MRI system, the advantages of the invention described can also be used in other circuit arrangements. For example, the precise location of the circuit board 309 and its components 311 are not of any great significance. They could also be cooled by another cooling unit with greater effort. The compact layout however has advantages as have been described above.

Portions of the system 100 and supporting components can take the form of hardware elements, software elements or elements containing both hardware and software. In one embodiment, the software portions can include, but are not limited to, firmware, resident software, microcode, etc. Furthermore, these software portions can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium (though propagation mediums in and of themselves as signal carriers are not included in the definition of physical computer-readable medium). Examples of a physical computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD. Both processors and program code for implementing each as aspect of the system can be centralized or distributed (or a combination thereof) as known to those skilled in the art.

A data processing system suitable for storing program code and for executing program code, which can be implemented in any of the above-referenced devices described herein, can include at least one processor coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution. I/O devices (including but not limited to keyboards, displays, pointing devices, etc.) can be coupled to the system either directly or through intervening I/O controllers.

Applicants present certain theoretical aspects above that are believed to be accurate that appear to explain observations made regarding embodiments of the invention. However, embodiments of the invention may be practiced without the theoretical aspects presented. Moreover, the theoretical aspects are presented with the understanding that Applicants do not seek to be bound by the theory presented.

While various embodiments of the present invention have been described above, it should be understood that they have been presented by way of example only, and not limitation. Numerous changes to the disclosed embodiments can be made in accordance with the disclosure herein without departing from the spirit or scope of the invention. Other configurations are also possible. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A detection device, comprising:
    at least one cooling unit comprising an encasement body of a non-electrically conductive composition and defining a first and second opposing planar surfaces of the cooling unit, a metal conduit disposed in the encasement body substantially parallel to the first surface, and a series of metal fins disposed in the encasement body and extending from the conduit substantially parallel to the first surface;
        a coolant delivery device coupled to the metal conduit and configured for directing a cooling fluid through the metal conduit;
    at least one detector unit in thermal contact with the cooling unit; and
    a film disposed on the each of the first and second surfaces, wherein a stiffness of the film is less than a stiffness of the encasement body.

2. The detection device of claim 1, wherein the at least one detector unit comprises a Positron Emission Tomography detector (PET detector).

3. The detection device of claim 2, wherein the PET detector comprises at least one Avalanche Photo Diode (APD).

4. The detection device of claim 1, further comprising:
    one or more non-electrically conductive inserts disposed in a portion of the encasement body between one of the first and second surfaces and one or more of the metals fins, the inserts having a thermal conductivity greater than a thermal conductivity of the encasement body.

5. The detection device of claim 1, wherein the fins extend in a plane substantially parallel and equidistant to the first and second planes.

6. The detection device of claim 1, further comprising:
    a first connector disposed in the encasement body at a first end of the metal conduit; and
    a second connector disposed in the encasement body at a second end of the metal conduit; and
    first and second coolant lines coupled to the first and second connectors and extending out of the encasement body.

7. A cooling unit for a sensor in a magnetic field, comprising:
    an encasement body comprising a non-electrically conductive composition and defining first and second opposing planar surfaces;
    a metal conduit disposed in the encasement body substantially parallel to the first surface;
    a series of metal fins disposed in the encasement body and extending from the conduit in a plane substantially parallel and equidistant to the first and second planes;
        a coolant delivery device coupled to the metal conduit and configured for directing a cooling fluid through the metal conduit; and
        a film disposed on the each of the first and second surfaces, wherein a stiffness of the film is less than a stiffness of the encasement body.

8. The cooling unit of claim 7, further comprising a controller for controlling the coolant delivery device, wherein the controller is configured for monitoring a temperature at the sensor and adjusting at least one of a temperature or a flow rate of the cooling fluid in response to a change in the temperature at the sensor.

9. The cooling unit of claim 7, further comprising:
    one or more non-electrically conductive inserts disposed in a portion of the encasement body between the first and second surfaces and one or more of the metals fins, the inserts having a thermal conductivity greater than a thermal conductivity of the encasement body.

10. The cooling unit of claim 7, further comprising:
    a first connector disposed in the encasement body at a first end of the metal conduit; and a second connector disposed in the encasement body at a second end of the metal conduit; and first and second coolant lines coupled to the first and second connectors and coupled to the coolant delivery device.

11. A cooling unit for a sensor in a magnetic field, comprising:

an encasement body comprising a non-electrically conductive composition and defining first and second opposing planar surfaces;

a planar metal conduit disposed in the encasement body substantially parallel to the first surface;

a series of metal fins disposed in the encasement body and extending from the planar metal conduit in a plane substantially parallel and equidistant to the first and second planes;

one or more non-electrically conductive portions in physical and thermal contact with at least the series of fins, the non-electrically conductive portions configured to at least partially fill a minimum cuboid volume defined by the planar metal conduit and the series of fins; and a film disposed on the each of the first and second surfaces, wherein a stiffness of the film is less than a stiffness of the encasement body.

12. The cooling unit of claim 10, wherein the fins are substantially parallel to the first plane.

* * * * *